United States Patent [19]

Taguchi et al.

[11] Patent Number: 5,592,135
[45] Date of Patent: Jan. 7, 1997

[54] SURFACE ACOUSTIC WAVE FILTER WITH DIFFERENT FILTER PORTIONS SATISFYING COMPLEX CONJUGATE RELATIONSHIP OF IMPEDANCES

[75] Inventors: Yutaka Taguchi, Ibaraki; Kazuo Eda, Nara; Keiji Onishi, Settsu; Shun-ichi Seki, Osaka, all of Japan

[73] Assignee: Matsushita Electric Industrial Co., Ltd., Kadoma, Japan

[21] Appl. No.: 373,033

[22] Filed: Jan. 17, 1995

[30] Foreign Application Priority Data

Jan. 20, 1994 [JP] Japan ................ 6-004471

[51] Int. Cl.$^6$ ................................. H03H 9/64
[52] U.S. Cl. ................ 333/193; 333/195; 310/313 R
[58] Field of Search ................ 333/193, 194, 333/195, 196; 310/313 R, 313 B, 313 D

[56] References Cited

U.S. PATENT DOCUMENTS

| | | | |
|---|---|---|---|
| 4,044,321 | 8/1977 | Vasile | 310/366 X |
| 4,166,258 | 8/1979 | Tseng | 333/195 |
| 4,387,352 | 6/1983 | Routh | 333/32 |
| 4,468,642 | 8/1984 | Hikita | 333/193 |
| 4,509,165 | 4/1985 | Tamura | 370/38 |
| 4,580,115 | 4/1986 | Sprengel | 333/194 |
| 4,672,339 | 6/1987 | Zibis et al. | 333/194 |
| 4,673,901 | 6/1987 | Falkenau et al. | 333/196 |
| 4,706,048 | 11/1987 | Atalar | 333/32 |
| 4,954,793 | 9/1990 | Misu et al. | 333/133 |

FOREIGN PATENT DOCUMENTS

| | | |
|---|---|---|
| 0541284 | 5/1993 | European Pat. Off. . |
| 2283587 | 6/1975 | France . |
| 52-19044 | 2/1977 | Japan . |
| 58-154917 | 9/1983 | Japan . |
| 63-132515 | 6/1988 | Japan . |
| 2237211 | 9/1990 | Japan . |
| 3222512 | 10/1991 | Japan . |
| 3278608 | 12/1991 | Japan . |
| 4253414 | 9/1992 | Japan . |
| 595246 | 4/1993 | Japan . |
| 613833 | 1/1994 | Japan . |
| 629779 | 2/1994 | Japan . |

OTHER PUBLICATIONS

U.S. Ser. No. 08/368,981, filed Dec. 27, 1994.
Search Report for European Appl. 95100534.7, mailed May 11, 1995.

Primary Examiner—Benny Lee
Assistant Examiner—David H. Vu
Attorney, Agent, or Firm—Renner, Otto, Boisselle, Sklar

[57] ABSTRACT

A SAW filter is configured so that a resonator-type filter portion, in which a plurality of SAW resonators are connected in series and in parallel, and a 3-electrode type serially coupled filter portion, in which three IDTs for inputting and outputting signals are interposed between reflectors, are serially connected on one and the same substrate. The design parameters of the respective SAW resonators are adjusted so that the impedances of respective sides of the filter portions, when viewed from the node of the resonator-type SAW filter portion and the 3-electrode type serially coupled SAW filter portion, substantially have a complex conjugate relationship with each other in the pass frequency band.

5 Claims, 15 Drawing Sheets

SURFACE ACOUSTIC WAVE FILTER WITH DIFFERENT FILTER PORTIONS SATISFYING COMPLEX CONJUGATE RELATIONSHIP OF IMPEDANCES

BACKGROUND OF THE INVENTION

1. Field of the Invention

The present invention relates to a surface acoustic wave filter utilizing a surface acoustic wave resonator. More particularly, the present invention relates to a surface acoustic wave filter used in a high frequency region.

2. Description of the Related Art

In recent years, intensive study has been positively conducted on a surface acoustic wave device which utilizes a surface acoustic wave, in order to apply the SAW device to a filter (hereinafter "surface acoustic wave" is abbreviated as SAW). SAW filters have been positively developed along with the recent development in mobile communications in which signals of higher frequencies are used.

There are some known methods for configuring a filter using a SAW device for a high frequency band, especially for a band of several hundreds of MHz. Typical known methods include, for example: a method for configuring a filter using a plurality of SAW resonators as described in Japanese Laid-Open Patent Publication No. 52-19044; a method for configuring a filter in which each of input and output interdigital transducers of a SAW resonator is divided into a plurality of portions (such a structure is called an "interdigitated interdigital transducer structure") as described in Japanese Laid-Open Patent Publication No. 58-154917; and a method for configuring a filter in which SAW resonators are disposed adjacently and capacitively coupled to each other as described in Japanese Laid-Open Patent Publication No. 3-222512.

SAW filters are required to have a smaller size and a much improved performance, in accordance with the miniaturization of mobile communication apparatus in recent years. In addition, SAW filters are more often used in various portions of the mobile communication apparatus. Specifically, SAW filters are used as an inter-stage filter in a transmitting circuit or a receiving circuit, an output filter of a local oscillator, and the like.

In general, filters are required to have various characteristics such as a low insertion loss in a pass band, a high stop band rejection, and a steep rise toward the pass band in a frequency characteristic. However, it is actually difficult to simultaneously satisfy all of these requirements. Accordingly, in general, some selected characteristics are significantly improved and enhanced. Depending on the resultant characteristics, the filter is used in an appropriate application.

The characteristic which is most significantly required for the SAW filter is typically the steep rise toward the pass band in the filter characteristic. However, in the SAW filter having a conventional configuration, if the stop band rejection is attempted to be increased, the steep rise in the filter characteristic toward the pass band, which is the most remarkable characteristic of the SAW filter, is typically lost.

The typical configuration of the above-mentioned conventional SAW filters will be described below.

The filter described in Japanese Laid-Open Patent Publication No. 52-19044 is configured by using a plurality of SAW resonators, and generally called "a resonator-type SAW filter". The resonator-type SAW filter generally has a frequency characteristic shown in FIG. 1, while its characteristics vary depending on a design of the SAW resonators. In this filter, the stop band rejection in the frequency region higher than the pass band can be greatly increased. However, in the frequency region lower than the pass band, the steepness of rising is degraded due to the parasitic impedance component. Thus, the filter characteristics are deteriorated.

The "interdigitated interdigital transducer structure type SAW filter" described in Japanese Laid-Open Patent Publication No. 58-154917 generally has a frequency characteristic shown in FIG. 2. In this type of filter, the ripple in the pass band is relatively large. In addition, this type of filter has another drawback in that it is difficult for its impedance to be matched with a 50Ω system.

The SAW filter having the configuration described in Japanese Laid-Open Patent Publication No. 3-222512 is generally called a "3-electrode type serially coupled SAW filter", and typically has a frequency characteristic shown in FIG. 3. This type of filter exhibits a steep rise in the frequency characteristic in the frequency region lower than the pass band, but has a drawback in that a large ripple occurs in the frequency region higher than the pass band.

In all of the above-described three types of conventional SAW filters, the input/output impedance may be disadvantageously deviated from the 50Ω system, depending on the filter characteristics to be realized. Although the filter may be able to be used even in the condition that the input/output impedance is mismatched, the filter used in such a condition cannot attain the inherent good characteristics. As a result, the filter is used with its characteristics deteriorated.

On the other hand, in order to match the impedance, it is necessary to provide an additional capacitance or inductance. However, such an additional impedance component connected results in that the filter characteristics are deviated from the desired and intended design.

As described above, the configurations of the conventional SAW filters have a disadvantage in that it is sometimes difficult to satisfactorily realize the desired filter characteristics while desirably adjusting and matching the impedance characteristic.

SUMMARY OF THE INVENTION

According to one aspect of the invention, a surface acoustic wave filter includes: a piezoelectric substrate; an input terminal for receiving an input signal; an output terminal for providing an output signal; and a first surface acoustic wave filter portion and a second surface acoustic wave filter portion each serially connected to a signal line connecting the input terminal and the output terminal, wherein the first surface acoustic wave filter portion includes at least one parallel surface acoustic wave resonator connected between a ground and the signal line, and at least one series surface acoustic wave resonator connected to the signal line in series, the second surface acoustic wave filter portion includes an input interdigital transducer for receiving a signal, two output interdigital transducers connected with each other and disposed as sandwiching the input interdigital transducer therebetween for providing an output, and two reflectors disposed as sandwiching the input interdigital transducer and the two output interdigital transducers therebetween, and impedances on respective sides of the first and second surface acoustic wave filter portions viewed from a connecting point therebetween substantially have a complex conjugate relationship with each other with respect to frequencies in a pass band of the surface acoustic wave filter.

In one embodiment, the surface acoustic wave filter further includes a third surface acoustic wave filter portion connected to the second surface acoustic wave filter portion, wherein the third surface acoustic wave filter portion includes: at least one parallel surface acoustic wave resonator connected between the ground and the signal line; and at least one series surface acoustic wave resonator connected to the signal line in series.

In another embodiment, the first surface acoustic wave filter portion includes at least one T-style basic unit configured with two of the series surface acoustic wave resonators and one of the parallel surface acoustic wave resonator, the parallel surface acoustic wave resonator being provided between the ground and a connecting point of the two series surface acoustic wave resonators.

In still another embodiment, the parallel surface acoustic wave resonator included in the first surface acoustic wave filter portion is connected most closely to the input terminal. Alternatively, the series surface acoustic wave resonator included in the first surface acoustic wave filter portion is connected most closely to the input terminal.

Thus, the invention described herein makes possible the advantage of providing a SAW filter which can simultaneously satisfy the characteristics such as a low insertion loss in a pass band, a high stop band rejection, and a steep rise in the frequency characteristic toward the pass band, and in which the impedance is easily matched with the 50Ω system.

This and other advantages of the present invention will become apparent to those skilled in the art upon reading and understanding the following detailed description with reference to the accompanying figures.

DESCRIPTION OF THE PREFERRED EMBODIMENTS

The invention will be described by way of illustrative examples with reference to the relevant figures.

EXAMPLE 1

Figure 4:
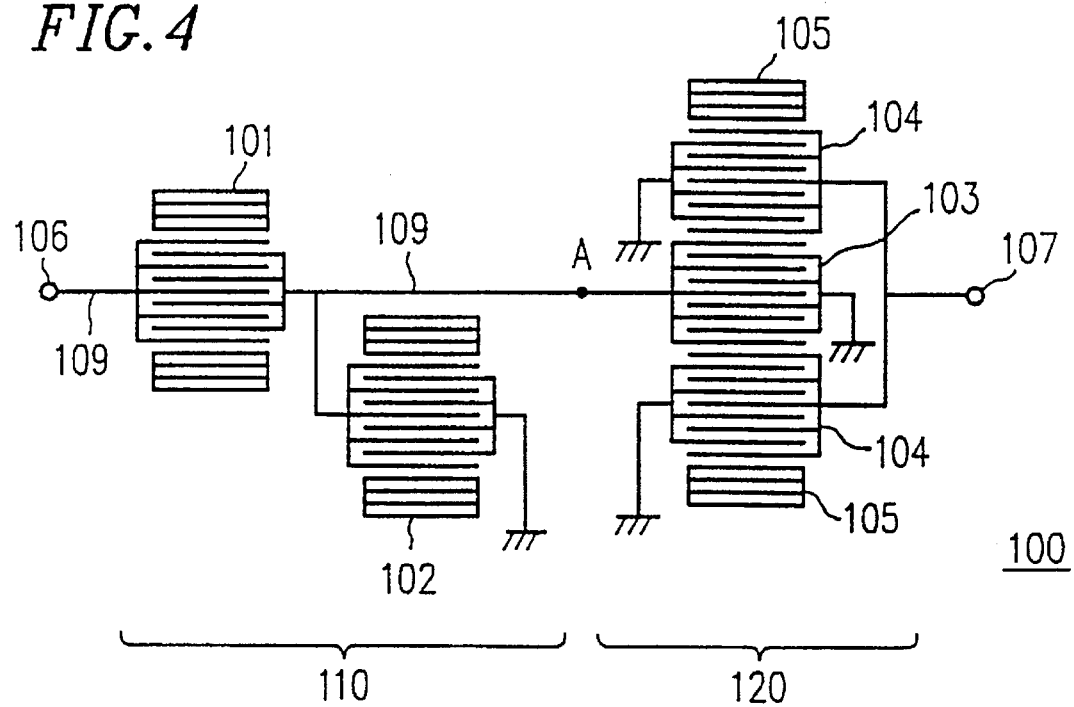
FIG. 4 is a diagram showing the configuration of a SAW filter in a first example of the invention.

FIG. 4 schematically shows the configuration of a SAW filter 100 in a first example of the invention. In the SAW filter 100 of this example, a resonator-type SAW filter portion 110 is disposed on one side closer to an input terminal 106, and a 3-electrode type serially coupled SAW filter portion 120 is disposed on the other side closer to an output terminal 107. The filter portions 110 and 120 are serially connected between the input terminal 106 and the output terminal 107.

The resonator-type SAW filter portion 110 includes a series SAW resonator 101 connected in series to a signal line 109 from the input terminal 106, and a parallel SAW resonator 102 connected between the signal line 109 and a ground.

Figure 5:
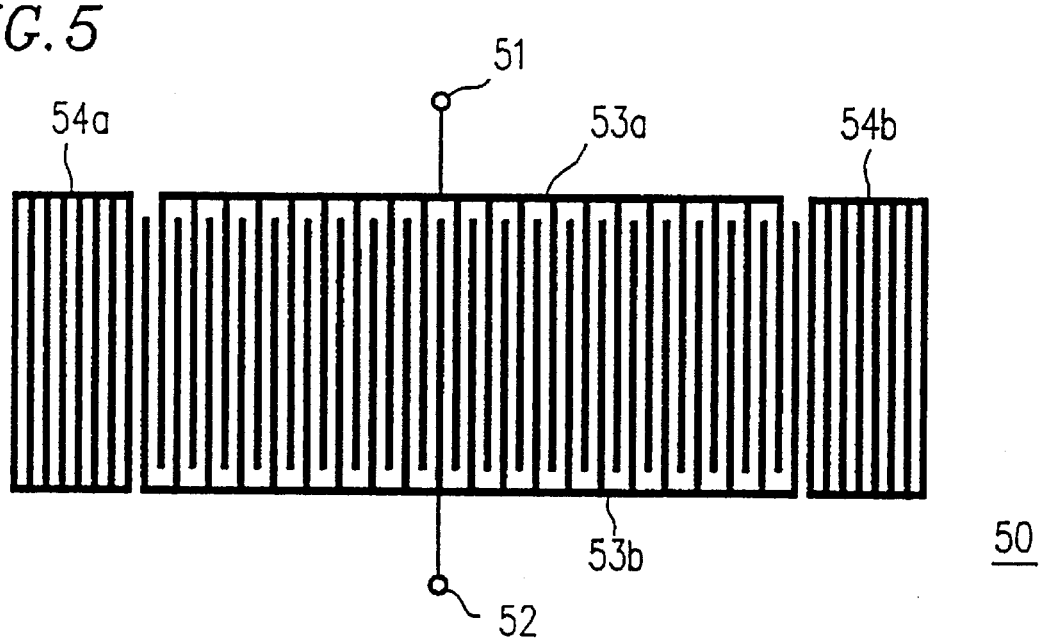
FIG. 5 is a diagram showing the configuration of a SAW resonator used in the SAW filter of the invention.

An exemplary configuration of each of the SAW resonators 101 and 102 is shown in FIG. 5. A SAW resonator 50 shown in FIG. 5 has a configuration in which two interdigital transducers (hereinafter referred to as IDTs) 53a and 53b, which are connected to an input terminal 51 and an output terminal 52, respectively, and are coupled to each other, are interposed between two reflectors 54a and 54b. In order to fabricate the SAW resonator 50, a pure aluminum film, for example, is deposited on a surface of a 36° Y-cut X-propagation lithium tantalate substrate, which is a piezoelectric substrate, by sputtering in a predetermined pattern. Thus, the IDTs 53a and 53b, and the reflectors 54a and 54b are formed.

The 3-electrode type serially coupled SAW filter portion 120 is formed by further dividing the IDT in the general SAW resonator shown in FIG. 5. The 3-electrode type serially coupled SAW filter portion 120 includes an input IDT 103 connected to the signal line 109 from the resonator-type SAW filter portion 110, two output IDTs 104 connected to the output terminal 107 and sandwiching the input IDT 103 therebetween, and two reflectors 105 further sandwiching the output IDTs 104 therebetween.

When the 3-electrode type serially coupled SAW filter portion 120 is to be fabricated, similar to the fabrication of the general SAW resonator 50 shown in FIG. 5, a pure aluminum film, for example, is deposited on a 36° Y-cut X-propagation lithium tantalate substrate which is a piezoelectric substrate by sputtering in a predetermined pattern. Thus, the IDTs 103 and 104, and the reflectors 105 are formed.

The fabrication method of the IDTs and reflectors in each resonator constituting the filter 100 is not limited to that described above. A material other than pure aluminum can be used for the formation of the IDTs and the reflectors. Moreover, the SAW resonator can be formed on a substrate of another type. Disposing all SAW resonators included in the filter 100 on one and the same substrate is advantageous in terms of the simplification of the fabrication process and a reduction in statistic variation of characteristics between the respective SAW resonators.

The configuration and the fabricating method of the SAW resonator 50, or the characteristics of the SAW resonator 50, are well known, so that the detailed description thereof is omitted.

In the SAW filter 100 having the configuration shown in FIG. 4, as for the series SAW resonator 101 in the resonator-type SAW filter portion 110, typical design parameters are, for example, as follows: the number of IDT pairs is 110; the pitch of the IDTs is 1.101 μm; a length of aperture of the IDTs is 50 μm; and the number of branches of the reflector is 50. As for the parallel SAW resonator 102, typical design parameters are, for example, as follows: the number of IDT pairs is 100; the pitch of the IDTs is 1.155 μm; the length of aperture of the IDTs is 130 μm; and the number of branches of the reflector is 50. As for the 3-electrode type serially coupled SAW filter portion 120, typical design parameters are, for example, as follows: the number of IDT pairs is 15.5 for the input IDT, and 22.5 for the output IDT; the pitch of the IDTs is 1.13 µm; a length of aperture of the IDTs is 220 µm; and the number of branches of the reflector is 150. For either of the filter portions 110 and 120, the thickness of the pure aluminum film is set to be 4100 Å. By setting the design parameters to the above-mentioned values, in the SAW filter 100 of this example, the central frequency of the pass band can be set to be about 900 MHz, and the width of the pass band is set to be 30 MHz. The pass band width is indicated by a value at the point at which the loss is varied from the peak value in the pass band by about 1.5 dB.

It is appreciated that the above values are only examples, and another configuration with other values can be realized.

Figure 1:
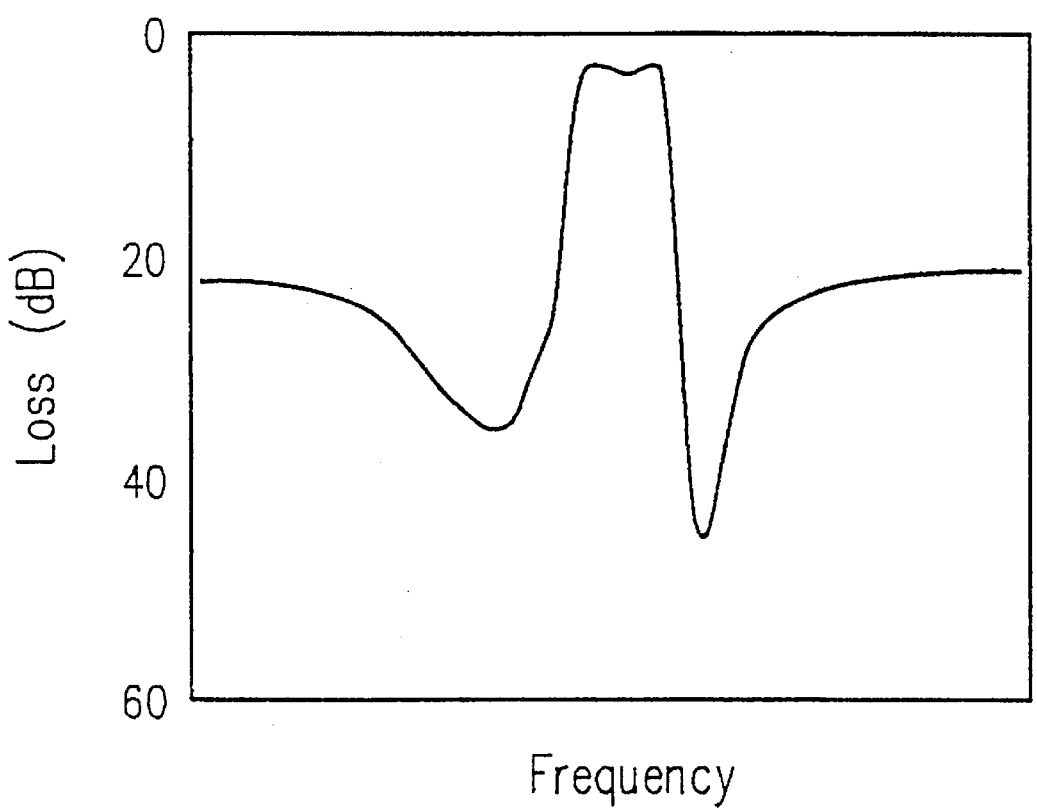
FIG. 1 is a diagram showing the frequency characteristic of a conventional SAW filter.
Figure 2:
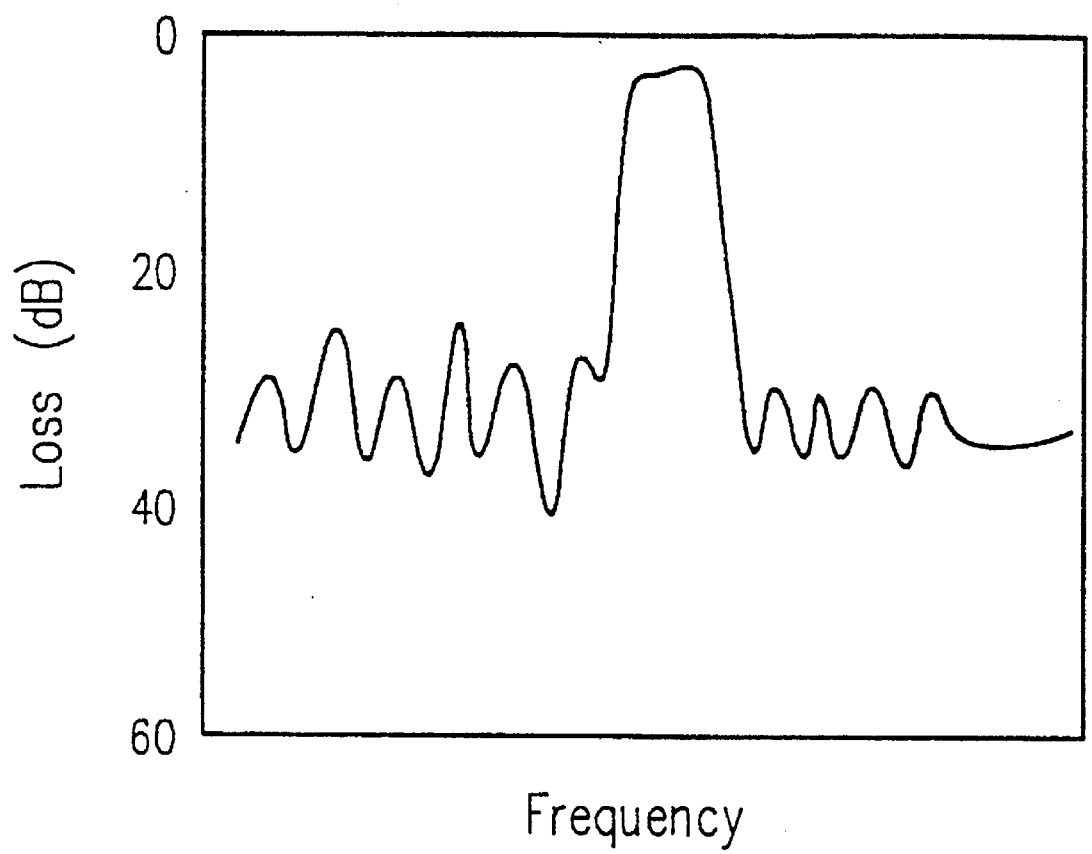
FIG. 2 is a diagram showing the frequency characteristic of another conventional SAW filter.
Figure 3:
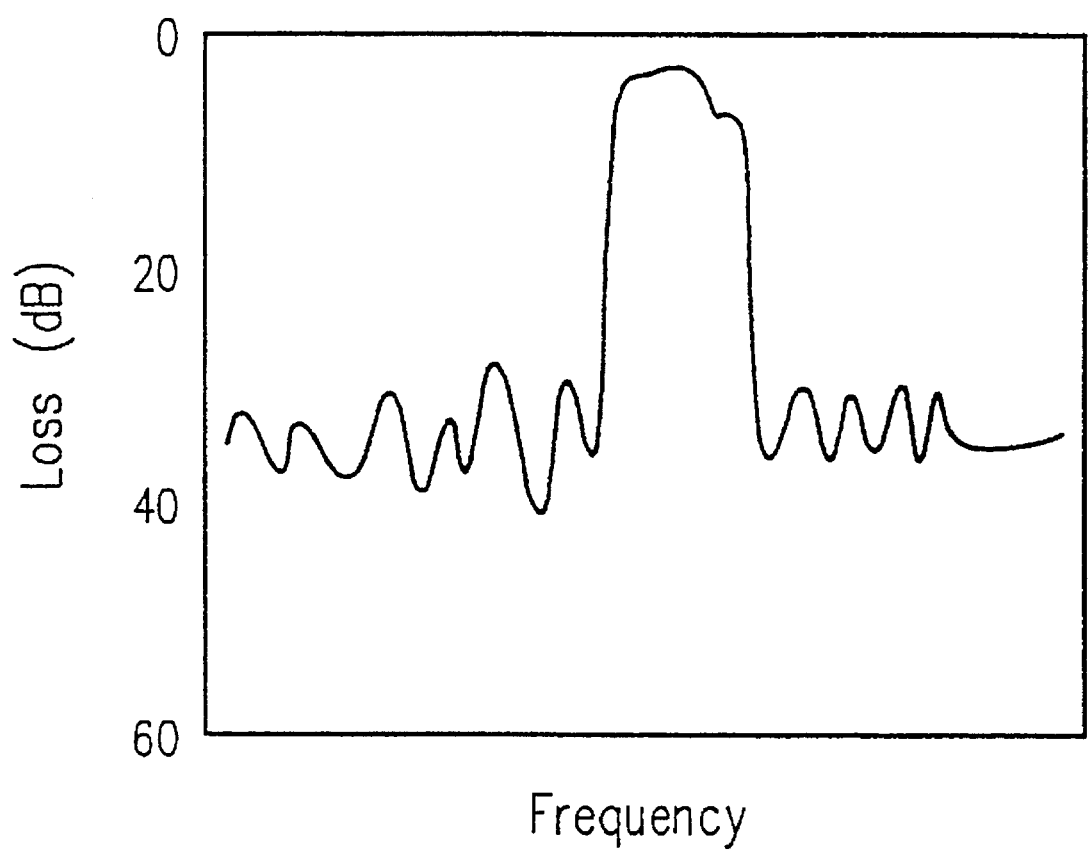
FIG. 3 is a diagram showing the frequency characteristic of still another conventional SAW filter.
Figure 6:
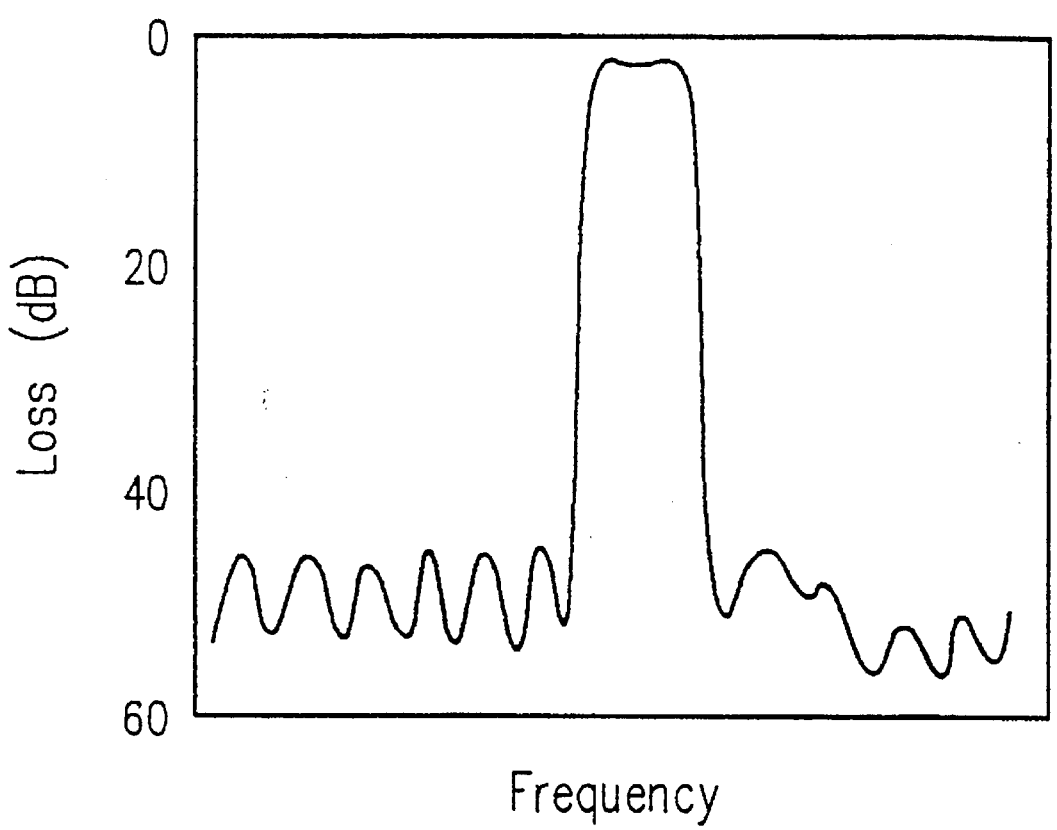
FIG. 6 is a diagram showing the frequency characteristic of the SAW filter in the first example of the invention.

The frequency characteristic of the SAW filter 100 in this example obtained by the above-mentioned design parameters is diagrammatically shown in FIG. 6. As compared with the frequency characteristics of the conventional filters described above with reference to FIGS. 1 to 3, the rise toward the pass band is very steep as shown in FIG. 6. This is because, by the configuration of the SAW filter 100 in this example shown in FIG. 4, the poor rise in the frequency region lower than the pass band, which is the inherent drawback of the resonator-type SAW filter, can be compensated for by the characteristics of the 3-electrode type serially coupled SAW filter portion 120. Also, the occurrence of ripple in the frequency region higher than the pass band, which is the inherent drawback of the 3-electrode type serially coupled SAW filter, can be compensated for by the utilization of the attenuation pole of the resonator-type SAW filter portion 110.

In addition, in the SAW filter 100 in this example, the stop band rejection can be minutely regulated by adjusting the capacitance ratio and the number of stages (the connected number of included series and parallel SAW resonators) in the resonator-type SAW filter portion 110. Accordingly, the stop band rejection at a desired level can be easily achieved.

Figure 7:
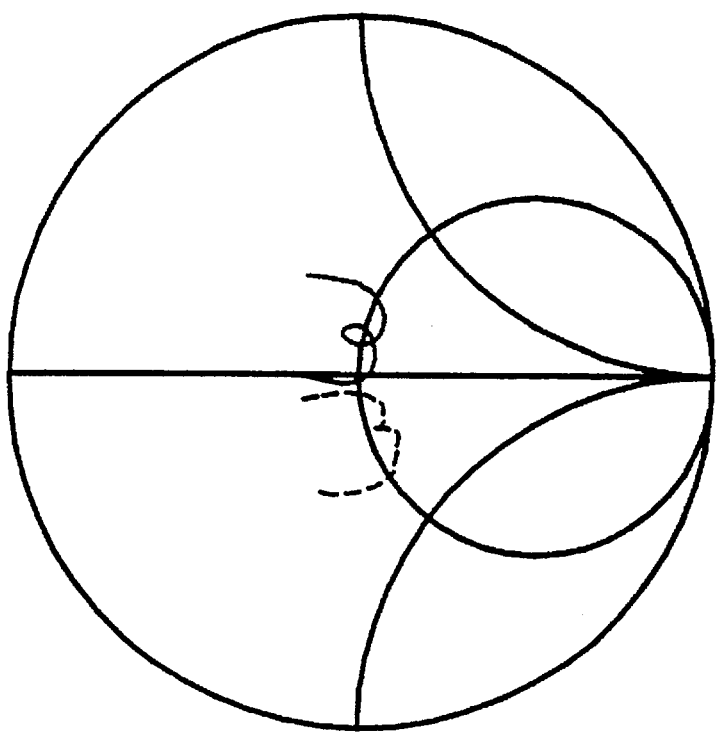
FIG. 7 is a diagram showing the impedance characteristic of the SAW filter in the first example of the invention.

FIG. 7 is a Smith chart indicating the impedance characteristics in the pass frequency band of the respective filter portions 110 and 120, when viewed from the node A on the signal line 109 as a connecting point of the resonator-type SAW filter portion 110 and the 3-electrode type serially coupled SAW filter portion 120, in the configuration of the SAW filter 100 shown in FIG. 4. In FIG. 7, the solid line indicates the characteristic of the 3-electrode type serially coupled SAW filter portion 120 and the broken line indicates the characteristic of the resonator-type SAW filter portion 110.

The impedances of the respective filter portions 110 and 120 are adjusted so as to substantially have a complex conjugate relationship with each other in the pass band. Accordingly, one of the filter portions 110 and 120 functions as an impedance matching circuit in the pass band for the other portion. Thus, even if the input/output impedances of the respective resonator-type SAW filter portion 110 and the 3-electrode type serially coupled SAW filter portion 120 are not accurately matched with the 50 Ω system, good matching with the 50 Ω impedance system can be realized in the filter 100 as a whole.

In addition, the above-mentioned impedance matching can be implemented by adjusting the design parameters of the resonator-type SAW filter portion 110 and the 3-electrode type serially coupled SAW filter portion 120. In the conventional filter which is different from the SAW filter of this example in the configuration, it is necessary to connect an additional impedance component such as capacitance or inductance in order to perform similar impedance matching. However, such an additional impedance component results in undesired filter characteristics which are deviated from the designed characteristics. In the configuration of this example, such an adverse influence on the filter characteristics does not occur, and it is possible to adjust and match the impedance characteristic.

As described above, by the configuration of the SAW filter 100 of this example, it is possible to realize a SAW filter with a low insertion loss, a high stop band rejection, and a steep rise, which is well matched with the 50 Ω impedance system.

EXAMPLE 2

Figure 8:
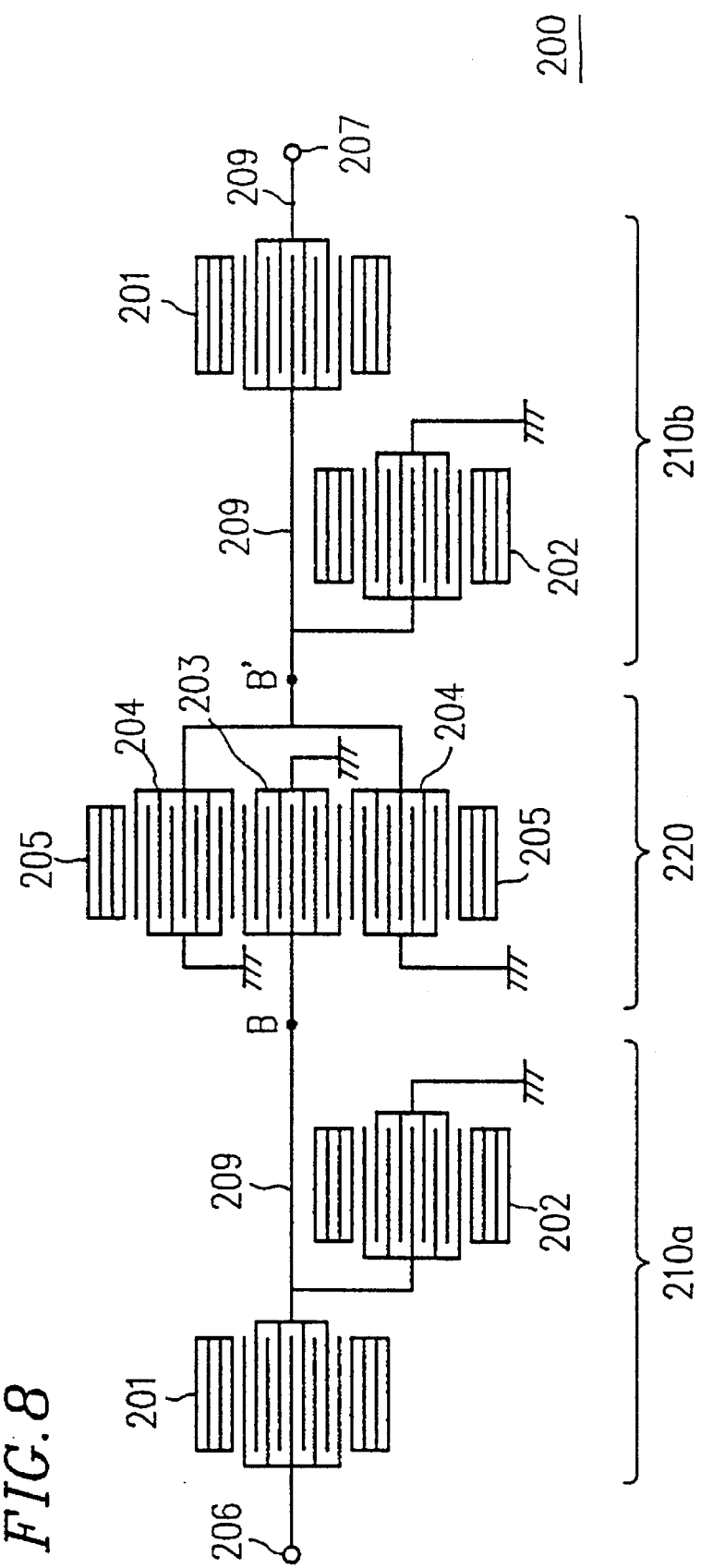
FIG. 8 is a diagram showing the configuration of a SAW filter in a second example of the invention.

FIG. 8 schematically shows the configuration of a SAW filter 200 in a second example of the invention. The SAW filter 200 of this example includes a first resonator-type SAW filter portion 210a disposed so as to be connected to an input terminal 206, a second resonator-type SAW filter portion 210b disposed so as to be connected to an output terminal 207, and a 3-electrode type serially coupled SAW filter portion 220 interposed so as to be serially connected to the portions 210a and 210b. In the SAW filter 200, like components to those in the SAW filter 100 in the first example are designated by like reference numerals.

Each of the resonator-type SAW filter portions 210a and 210b includes a series SAW resonator 201 connected in series to a signal line 209 from the input terminal 206 (or the output terminal 207), and a parallel SAW resonator 202 connected between the signal line 209 and a ground.

The configuration of each of the SAW resonators 201 and 202 is the same as that described in the first example with reference to FIG. 5, so that the detailed description thereof is not repeated.

Similar to the 3-electrode type serially coupled SAW filter portion 120 in the first example, the 3-electrode type serially coupled SAW filter portion 220 is formed by further dividing the IDT in the general SAW resonator 50 shown in FIG. 5. The 3-electrode type serially coupled SAW filter portion 220 includes an input IDT 203 connected to the first resonator-type SAW filter portion 210a, two output IDTs 204 connected to the second resonator-type SAW filter portion 210b and sandwiching the input IDT 203 therebetween, and two reflectors 205 further sandwiching the output IDTs 204 therebetween.

The fabrication method and the materials to be employed for the 3-electrode type serially coupled SAW filter portion 220 are the same as those in the first example, so that the detailed description thereof is not repeated.

In the case of the SAW filter 200 having the configuration shown in FIG. 8, as for the series SAW resonator 201 in the resonator-type SAW filter portions 210a and 210b, typical design parameters are, for example, as follows: the number of IDT pairs is 110; the pitch of the IDTs is 1.101 µm; a length of aperture of the IDTs is 50 µm; and the number of branches of the reflector is 50. As for the parallel SAW resonator 202, typical design parameters are, for example, as follows: the number of IDT pairs is 100; the pitch of the IDTs is 1.155 µm; the length of aperture of the IDTs is 130 µm; and the number of branches of the reflector is 50. As for the 3-electrode type serially coupled SAW filter portion 220, typical design parameters are, for example, as follows: the number of IDT pairs is 15.5 for the input IDT, and 22.5 for the output IDT; the pitch of the IDTs is 1.13 µm; a length of aperture of the IDTs is 220 µm; and the number of branches of the reflector is 150. For either of the filter portions 210a, 210b and 220, the thickness of the pure aluminum film is set to be 4100 Å. By setting the design parameters to the above-mentioned values, in the SAW filter 200 of this example, the central frequency of the pass band can be set to be about 900 MHz, and the width of the pass band is set to be 30 MHz. The pass band width is indicated by a value at the point at which the loss is varied from the peak value in the pass band by about 1.5 dB.

It is appreciated that the above values are only examples, and another configuration with other values can be realized.

Figure 9:
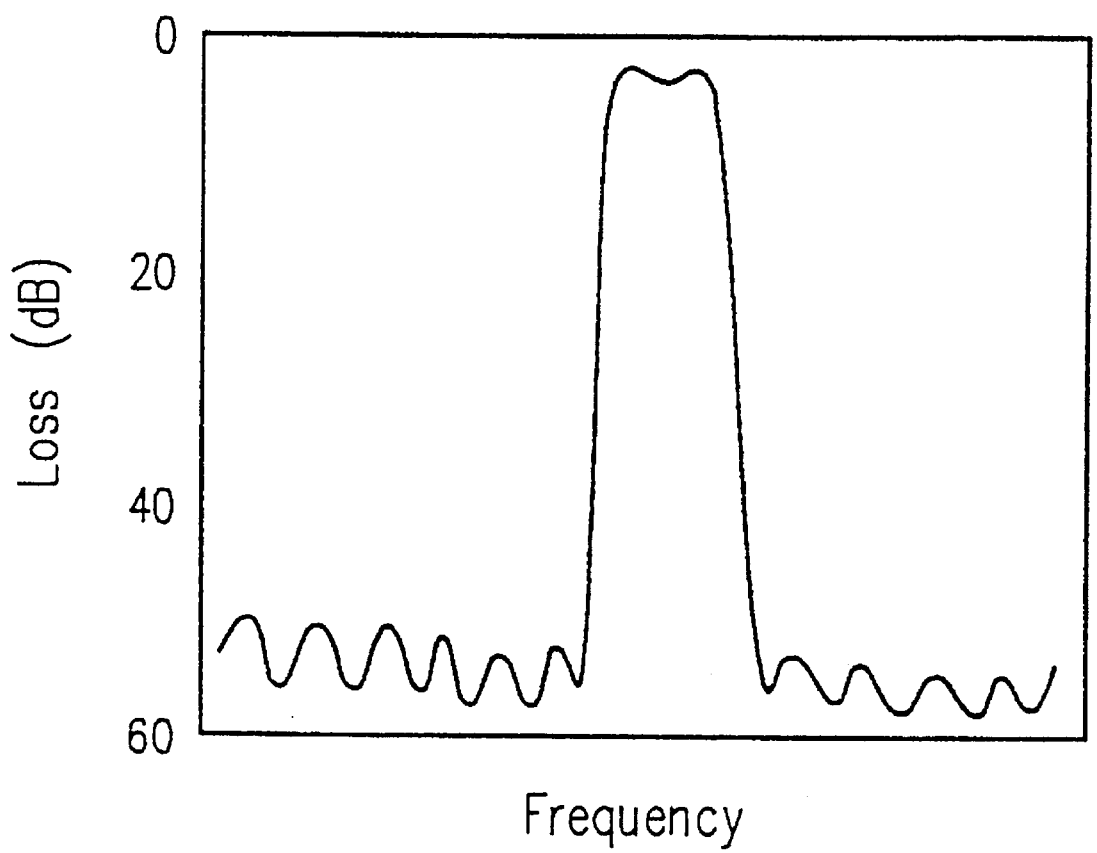
FIG. 9 is a diagram showing the frequency characteristic of the SAW filter in the second example of the invention.

The frequency characteristic of the SAW filter 200 in this example obtained by the above-mentioned design parameters is diagrammatically shown in FIG. 9. Since the number of resonator-type SAW filter portions is increased, the insertion loss in the pass band is slightly degraded, but the stop band rejection is increased. As compared with the frequency characteristics of the conventional filters described above with reference to FIGS. 1 to 3, the rise toward the pass band is very steep as in the first example. The reason is the same as that described in the first example.

In addition, similar to the first example, in the SAW filter 200 in this example, the stop band rejection can be minutely regulated by adjusting the capacitance ratio and the number of stages (the connected number of included series and parallel SAW resonators) in the resonator-type SAW filter portions 210a and 210b. Accordingly, the stop band rejection at a desired level can be easily achieved.

Figure 10:
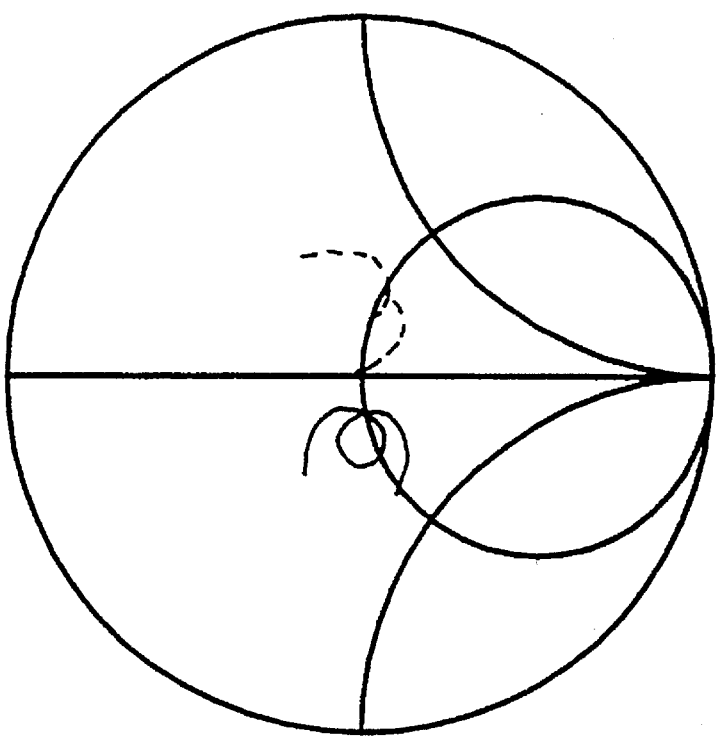
FIG. 10 is a diagram showing the impedance characteristic of the SAW filter in the second example of the invention.

FIG. 10 is a Smith chart indicating the impedance characteristics in the pass frequency bands on respective sides of the filter portions 210a and 220, when viewed from the node B on the signal line 209 as a connecting point of the first resonator-type SAW filter portion 210a and the 3-electrode type serially coupled SAW filter portion 220, in the configuration of the SAW filter 200 shown in FIG. 8. In FIG. 10, the solid line indicates the characteristic on the side of the 3-electrode type serially coupled SAW filter portion 220 and the broken line indicates the characteristic on the side of the first resonator-type SAW filter portion 210a. The impedances on the respective sides of the filter portions 210a and 220 are adjusted so as to substantially have a complex conjugate relationship with each other in the pass band. Accordingly, the same effects as those in the first example can be attained. Also, the impedance matching can be easily performed as in the first example.

Since the SAW filter 200 in this example has a symmetric configuration as a whole, the same impedance characteristics as those in FIG. 10 can be obtained when viewed as to both sides from the node B' on the signal line 209 as a connecting point of the 3-electrode type serially coupled SAW filter portion 220 and the second resonator-type SAW filter portion 210b.

As described above, by the configuration of the SAW filter 200 of this example, it is possible to realize a SAW filter with a low insertion loss, a high stop band rejection, and a steep rise, which is well matched with the 50 Ω impedance system.

In addition, the SAW filter 200 of this example has an advantage in that the impedance matching is more easily performed for the filter 200 as a whole, as compared with the SAW filter 100 in the first example, for the following reason. In the second example, the first and second resonator-type SAW filter portions 210a and 210b are formed on both sides of the 3-electrode type serially coupled SAW filter portion 220, respectively. Accordingly, by independently and separately adjusting the design parameters of the respective resonator-type SAW filter portions 210a and 210b, the input impedance and the output impedance can be independently and separately adjusted for the filter 200 as a whole.

EXAMPLE 3

Figure 11:
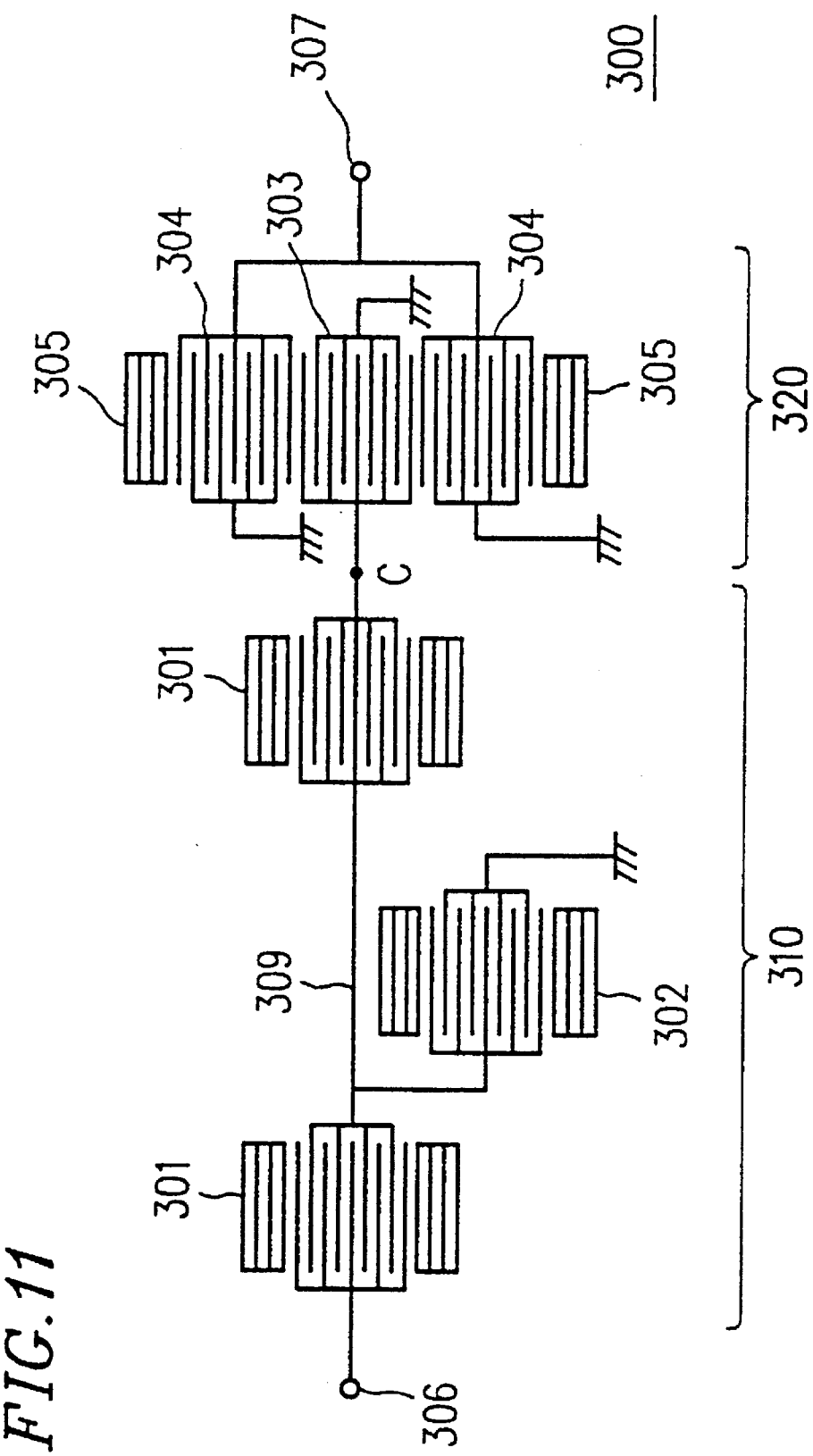
FIG. 11 is a diagram showing the configuration of a SAW filter in a third example of the invention.

FIG. 11 schematically shows the configuration of a SAW filter 300 in a third example of the invention. In the SAW filter 300 of this example, a resonator-type SAW filter portion 310 is disposed on the side closer to an input terminal 306, and a 3-electrode type serially coupled SAW filter portion 320 is disposed on the side closer to an output terminal 307. The filter portions 310 and 320 are serially connected between the input and the output terminals 306 and 307. In the SAW filter 300 of this example, the resonator-type SAW filter portion 310 has a T-shaped configuration including two series resonators 301 and a parallel resonator 302. This T-shaped unit serves as a fundamental unit of the resonator-type SAW filter portion 310.

In the SAW filter 300, like components to those in the SAW filters 100 and 200 in the first and second examples are designated by like reference numerals.

In the case of the SAW filter 300 having the configuration shown in FIG. 11, as for the series SAW resonator 301 in the resonator-type SAW filter portion 310, typical design parameters are, for example, as follows: the number of IDT pairs is 110; the pitch of the IDTs is 1.101 μm; a length of aperture of the IDTs is 50 μm; and the number of branches of the reflector is 50. As for the parallel SAW resonator 302, typical design parameters are, for example, as follows: the number of IDT pairs is 100; the pitch of the IDTs is 1,155 μm; the length of aperture of the IDTs is 130 μm; and the number of branches of the reflector is 50. As for the 3-electrode type serially coupled SAW filter portion 320, typical design parameters are, for example, as follows: the number of IDT pairs is 15.5 for the input IDT, and 22.5 for the output IDT; the pitch of the IDTs is 1.13 μm; a length of aperture of the IDTs is 220 μm; and the number of branches of the reflector is 150. For either of the filter portions 310 and 320, the thickness of the pure aluminum film is set to be 4100 Å. By setting the design parameters to the above-mentioned values, in the SAW filter 300 of this example, the central frequency of the pass band can be set to be about 900 MHz, and the width of the pass band is set to be 30 MHz. The pass band width is indicated by a value at the point at which the loss is varied from the peak value in the pass band by about 1.5 dB.

It is appreciated that the above values are only examples, and another configuration with other values can be realized.

Figure 12:
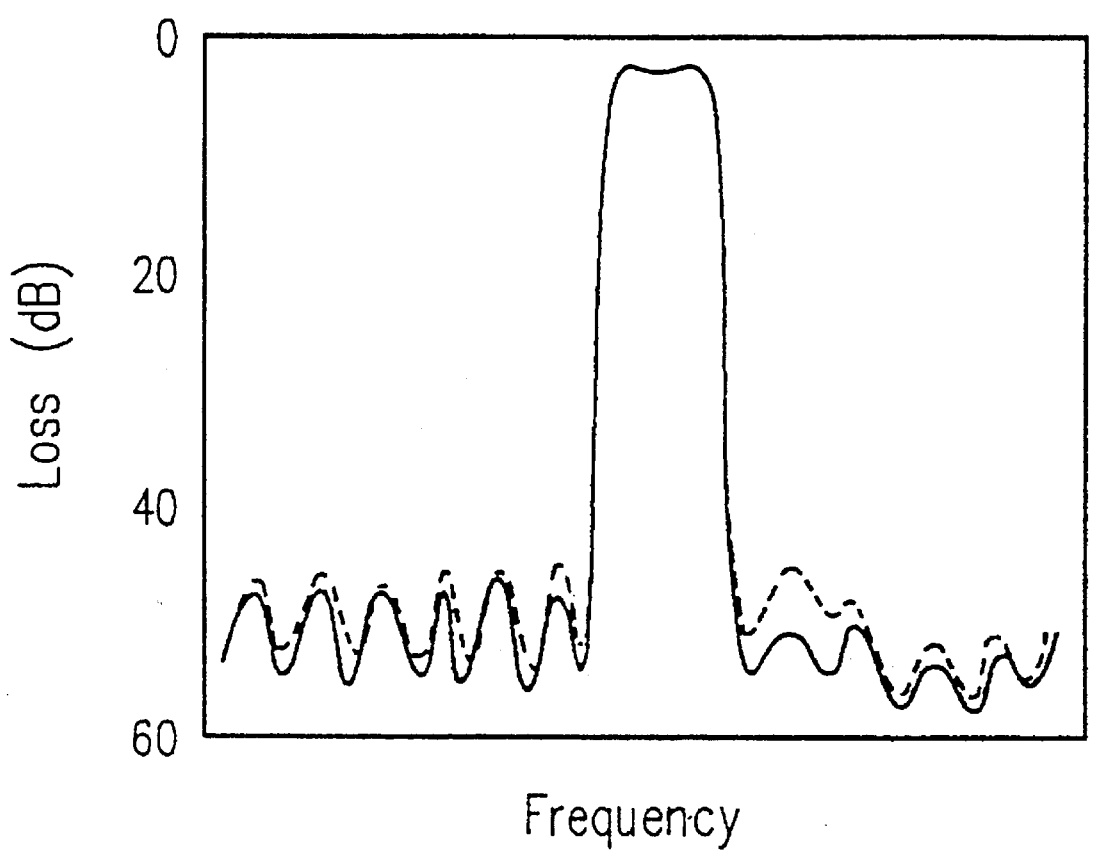
FIG. 12 is a diagram showing the frequency characteristic of the SAW filter in the third example of the invention.

The frequency characteristic of the SAW filter 300 in this example obtained by the above-mentioned design parameters is diagrammatically shown in FIG. 12. For comparison, the frequency characteristic of the SAW filter 100 of the first example (which is shown in FIG. 6) is plotted by a broken line. In order to understand the compared result, FIG. 12 shows the results when the SAW filters 100 and 300 are designed so as to have substantially the same insertion loss.

It is found from FIG. 12 that both characteristics exhibit a steep rise toward the pass band. However, in the characteristic of the SAW filter 300 of this example shown by the solid line, the stop band rejection is increased in the region higher than the pass band. This is because the number of the connected SAW resonators is increased on the resonator-type SAW filter portion 310.

Figure 13:
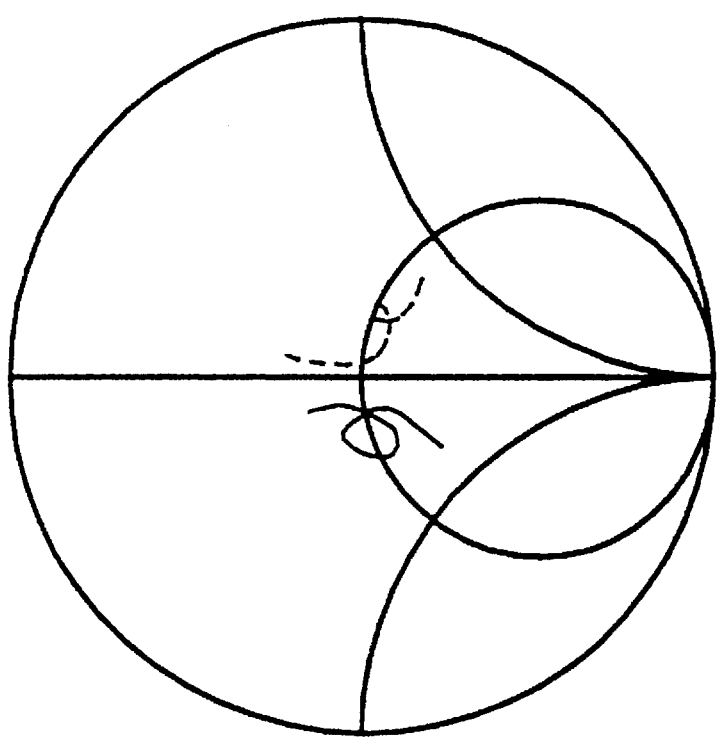
FIG. 13 is a diagram showing the impedance characteristic of the SAW filter in the third example of the invention.

FIG. 13 is a Smith chart indicating the impedance characteristics in the pass frequency bands on respective sides of the input terminal 306 and the output terminal 307, when viewed from the node C on the signal line 309, in the configuration of the SAW filter 300 shown in FIG. 11. In FIG. 13, the solid line indicates the characteristic on the side of the output terminal 307 (the 3-electrode type serially coupled SAW filter portion 320) and the broken line indicates the characteristic on the side of the input terminal 306 (the resonator-type SAW filter portion 310). The impedances of the respective sides are adjusted so as to substantially have a complex conjugate relationship with each other in the pass band. Accordingly, the same effects as those in the first and second examples can be attained. Also, the impedance matching can be easily performed as in the first and second examples.

As described above, by the configuration of the SAW filter 300 of this example, it is possible to realize a SAW filter with a low insertion loss, a high stop band rejection, and a steep rise, which is well matched with the 50 Ω impedance system.

In the above-described example, it is assumed that the resonator-type SAW filter portion 310 includes one T-shaped unit. Alternatively, the resonator-type SAW filter portion 310 may be configured so as to include a plurality of T-shaped units.

Furthermore, the resonator-type SAW filter portions 210a and 210b as previously described in the second example may be configured so as to include one or more T-shaped units.

In the description of the first to third examples, for simplifying and clarifying the explanation, the input and output direction of signals is fixedly determined. However, in the actual implementation of the invention, the input and output direction of signals is not limited to that shown in the figures used for the description of the first to third examples. For example, the input terminals 106, 206 and 306 as well as the output terminals 107, 207 and 307 may be reversely located in the configurations of the SAW filters 100, 200 and 300 shown in FIGS. 4, 8 and 11, respectively, whereby the same effects still can be attained.

EXAMPLE 4

As a fourth example according to the invention, an improved arrangement of SAW resonators constituting the resonator-type SAW filter portion 110 in the SAW filter 100 described in the first example will be described.

Figure 14A:
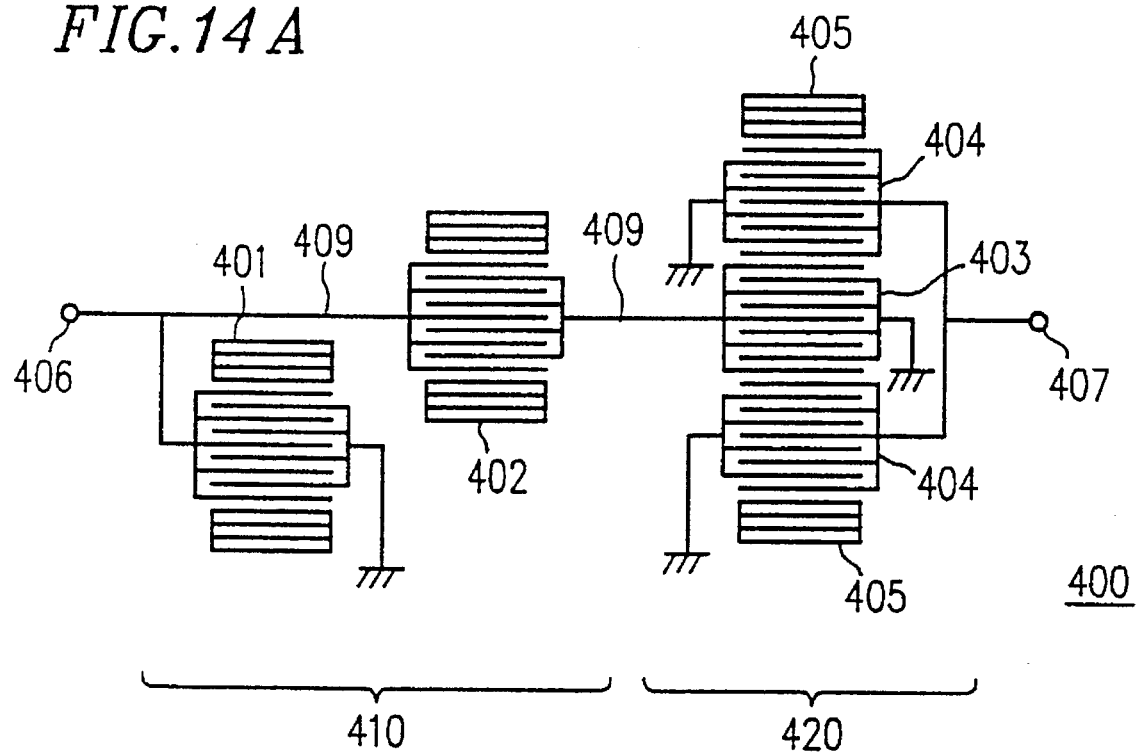
FIGS. 14A and 14B are diagrams each showing the configuration of a SAW filter in a fourth example of the invention.
Figure 14B:
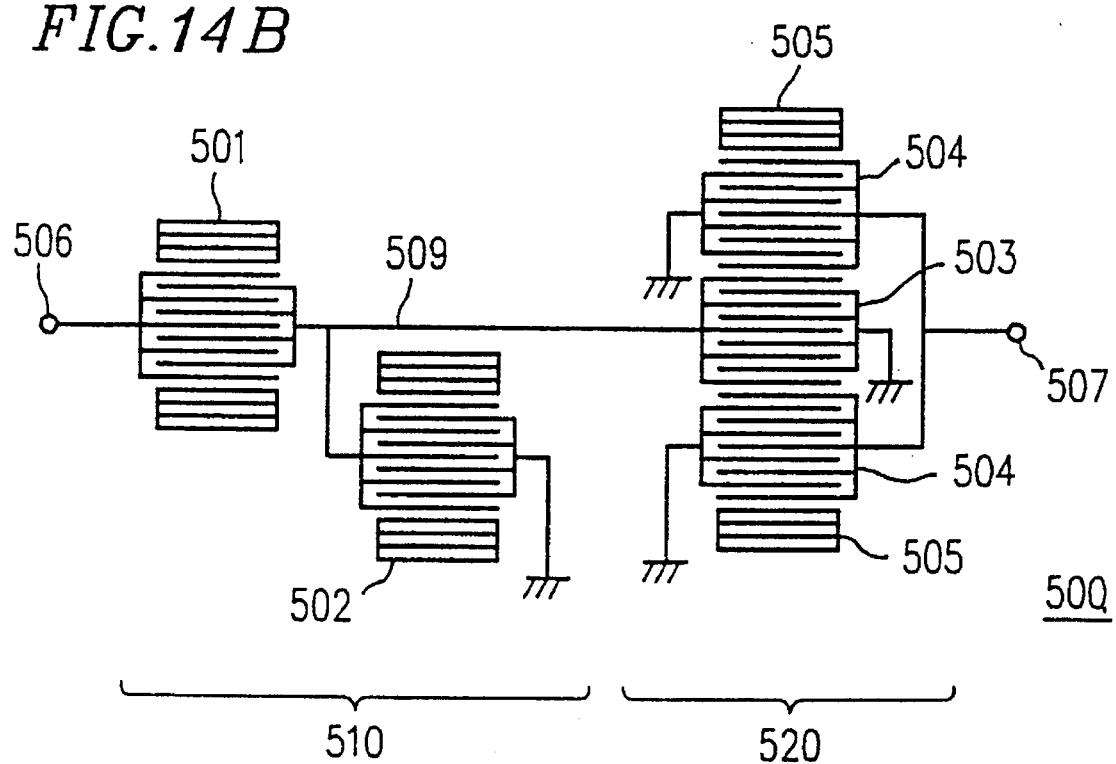

In a SAW filter 400 shown in FIG. 14A and a SAW filter 500 shown in FIG. 14B, a resonator-type SAW filter portion 410 or 510 is disposed on the side closer to an input terminal 406 or 506, respectively, and a 3-electrode type serially coupled SAW filter portion 420 or 520 is disposed on the side closer to an output terminal 407 or 507, respectively. The resonator-type SAW filter portion 410 or 510 and the 3-electrode type serially coupled SAW filter portion 420 or 520 are serially coupled between the input and output terminals 406 and 407, or 506 and 507, respectively. The basic configuration is the same as that of the SAW filter 100 in the first example described with reference to FIG. 4. Since like reference numerals indicate like components, the detailed descriptions thereof are omitted.

Figure 15:
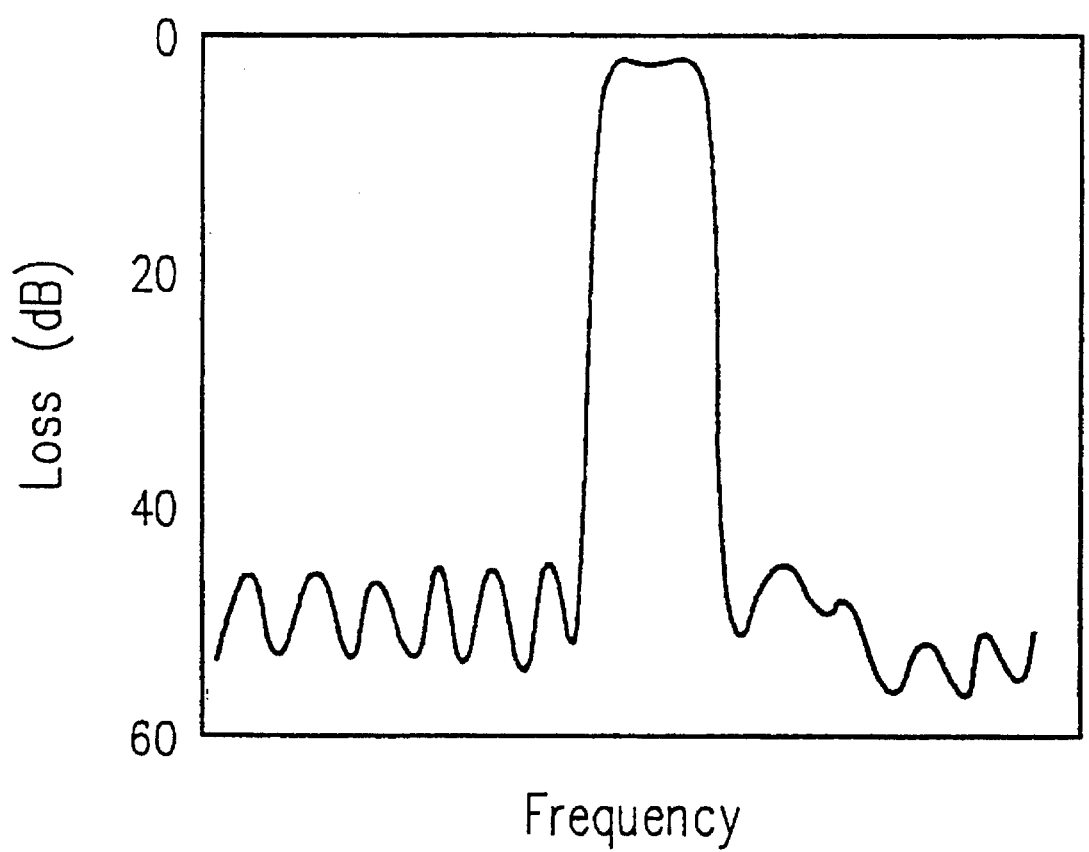
FIG. 15 is a diagram showing the frequency characteristic of the SAW filter in the fourth example of the invention.

By forming each SAW resonator using the previously mentioned design parameters, each of the SAW filters 400 and 500 has the central frequency of the pass band of 900 MHz, and the pass band width of about 30 MHz. The pass band width is indicated by a value at a point at which the loss is varied from the peak value in the pass band by about 1.5 dB. As for both the SAW filters 400 and 500, the frequency characteristic as shown in FIG. 15 can be obtained.

In the resonator-type SAW filter portion 410 of the SAW filter 400 shown in FIG. 14A, a resonator which is connected most closely to the input terminal 406 is the parallel SAW resonator 401 connected between the signal line 409 and the ground, as in the SAW filter 100 of the first example. On the other hand, in the SAW filter 500 shown in FIG. 14B, unlike the SAW filters 100 and 400, the series SAW resonator 501 connected in series to the signal line 509 is connected most closely to the input terminal 506.

When a signal having a frequency which is higher than the central frequency of the pass band by 60 MHz and having a power of 1 W is applied to the two SAW filters 400 and 500 in an ambient atmosphere at 100° C., the filter characteristics of the SAW filter 400 are not significantly varied, but the filter characteristics of the SAW filter 500 are deteriorated. On the other hand, when a signal having a frequency which is lower than the central frequency of the pass band by 60 MHz and having a power of 1 W is applied in an ambient atmosphere at 100° C., the filter characteristics of the SAW filter 500 are not significantly varied, but the filter characteristics of the SAW filter 400 are deteriorated.

Accordingly, when there is a probability that a signal having a frequency higher than the pass band is applied, it is desired that the parallel SAW resonator 401 is connected most closely to the input terminal 406 as in the SAW filter 400 in FIG. 14A. Alternatively, when there is a probability that a signal having a frequency lower than the pass band is applied, it is desired that the series SAW resonator 501 is connected most closely to the input terminal 506 as in the SAW filter 500 in FIG. 14B. In this way, by desirably selecting the arrangement of SAW resonators, the singular point of the SAW resonator is prevented from coinciding with the frequency of the input signal.

The above-described specific values of frequency and power of the applied signal are only an example for explaining the effects of this example.

Furthermore, although the fourth example of the invention is explained above in the form of improvement of the first example, it is appreciated that the same scheme is applicable to other examples of the invention.

In the first to fourth examples, the electrode pattern is formed by depositing pure aluminum on a 36° Y-cut X-propagation lithium tantalate substrate, for fabricating each SAW resonator. However, the materials are not limited to those in the above-described examples. For example, another type of substrate such as a 41° Y-cut X-propagation lithium niobate substrate can be used. In addition, in view of the durability, aluminum which contains copper may be used instead of pure aluminum. In such a case, an electrode having superior durability can be formed.

In the above description, all of the SAW resonators constituting the resonator-type SAW filter portion include respective reflectors as shown in FIG. 5. However, if a substrate having a large electromechanical coupling factor such as a 41° Y-cut X-propagation lithium niobate substrate is used, the reflectivity per electrode branch included in the IDT is sufficiently high, so that the reflectors may sometimes be omitted.

As described above, according to the invention, a SAW filter is configured so that a resonator-type filter portion, in which a plurality of SAW resonators are connected in series and in parallel, and a 3-electrode type serially coupled filter portion, in which three IDTs for inputting and outputting signals are interposed between reflectors, are serially connected on one and the same substrate. The design parameters of the respective SAW resonators are adjusted so that the impedances on respective sides of the filter portions, when viewed from the node of the resonator-type SAW filter portion and the 3-electrode type serially coupled SAW filter portion, substantially have a complex conjugate relationship with each other in the pass band.

Accordingly, in the frequency region lower than the pass band of the filter, a steep rise of the frequency characteristic toward the pass band can be realized by the function of the 3-electrode type serially coupled SAW filter portion, and in the frequency region higher than the pass band, a steep rise of the frequency characteristic can be realized by the function of the resonator-type SAW filter portion.

In addition, since the impedances on the respective sides of the filter portions, when viewed from the node of the filter portions, are designed so as to have a complex conjugate relationship with each other in the pass band, one of the filter portions functions as an impedance matching circuit for the other with respect to the frequencies in the pass band. As a result, even when the input/output impedance of each filter portion is not accurately matched with the 50 Ω system, the filter as a whole is matched with the 50 Ω impedance system.

Therefore, it is possible to provide a filter with a low loss, a small ripple in the pass band, and a steep rise, which is well matched with the 50 Ω impedance system.

According to the invention, the poor rise in the frequency region lower than the pass band, which is the inherent drawback of the resonator-type SAW filter, can be compensated for by the characteristics of the 3-electrode type serially coupled SAW filter portion. Also, the occurrence of ripple in the frequency region higher than the pass band, which is the inherent drawback of the 3-electrode type serially coupled SAW filter, can be compensated for by the utilization of the attenuation pole of the resonator-type SAW filter portion.

A desirable stop band rejection can be achieved in the following manner in the SAW filter having the configuration according to the invention: first, the stop band rejection of the filter is coarsely adjusted in a digital manner by changing the number of connected stages in the 3-electrode type serially connected SAW filter portion, and then is precisely adjusted in an analog manner by adjusting the capacitance ratio and the number of connected stages of the SAW resonators constituting the resonator-type SAW filter portion. Accordingly, in the SAW filter of the invention, the desired filter characteristics can be easily realized.

In the configuration of the invention, by independently and separately setting the design parameters of the resonator-type SAW filter portion and the 3-electrode type serially connected filter portion, the respective input/output impedances can be independently adjusted. When the impedances are to be adjusted, it is unnecessary to connect any additional impedance component such as capacitance. Accordingly, the input/output impedance of the filter as a whole can be easily set to a desired value, so that the impedance matching can be easily realized. Moreover, both the desired filter characteristics and the desired impedance characteristic are easily realized simultaneously.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A surface acoustic wave filter comprising:

a piezoelectric substrate;

an input terminal for receiving an input signal;

an output terminal for providing an output signal; and a first surface acoustic wave filter portion and a second surface acoustic wave filter portion each serially connected to a signal line connecting the input terminal and the output terminal, wherein the first surface acoustic wave filter portion includes at least one parallel surface acoustic wave resonator connected between a ground and the signal line, and at least one series surface acoustic wave resonator connected to the signal line in series, the second surface acoustic wave filter portion includes an input interdigital transducer for receiving a signal, two output interdigital transducers connected with each other and disposed as sandwiching the input interdigital transducer therebetween for providing an output, and two reflectors disposed as sandwiching the input interdigital transducer and the two output interdigital transducers therebetween, and impedances on respective sides of the first and second surface acoustic wave filter portions viewed from a connecting point therebetween substantially have a complex conjugate relationship with each other with respect to frequencies in a pass band of the surface acoustic wave filter.

2. A surface acoustic wave filter according to claim 1, further comprising a third surface acoustic wave filter portion connected to the second surface acoustic wave filter portion, wherein the third surface acoustic wave filter portion includes: at least one parallel surface acoustic wave resonator connected between the ground and the signal line; and at least one series surface acoustic wave resonator connected to the signal line in series.

3. A surface acoustic wave filter according to claim 1, wherein the first surface acoustic wave filter portion comprises at least one T-style basic unit configured with two of the series surface acoustic wave resonators and one of the parallel surface acoustic wave resonator, the parallel surface acoustic wave resonator being provided between the ground and a connecting point of the two series surface acoustic wave resonators.

4. A surface acoustic wave filter according to claim 1, wherein the parallel surface acoustic wave resonator included in the first surface acoustic wave filter portion is connected most closely to the input terminal.

5. A surface acoustic wave filter according to claim 1, wherein the series surface acoustic wave resonator included in the first surface acoustic wave filter portion is connected most closely to the input terminal.

* * * * *